(12) United States Patent
Yunger et al.

(10) Patent No.: US 10,971,893 B2
(45) Date of Patent: Apr. 6, 2021

(54) LASER UNITS

(71) Applicant: HP Indigo B.V., Amstelveen (NL)

(72) Inventors: Yuval Yunger, Ness Ziona (IL); Benny Kimelman, Rishon le Zion (IL); Tsahi Geller, Jerusalem (IL)

(73) Assignee: HP Indigo B.V., Amstelveen (NL)

( * ) Notice: Subject to any disclaimer, the term of this patent is extended or adjusted under 35 U.S.C. 154(b) by 0 days.

(21) Appl. No.: 16/465,589

(22) PCT Filed: Feb. 1, 2017

(86) PCT No.: PCT/EP2017/052164
§ 371 (c)(1),
(2) Date: May 31, 2019

(87) PCT Pub. No.: WO2018/141380
PCT Pub. Date: Aug. 9, 2018

(65) Prior Publication Data
US 2019/0386458 A1    Dec. 19, 2019

(51) Int. Cl.
| H01S 5/042 | (2006.01) |
| H01S 5/024 | (2006.01) |
| G06K 15/12 | (2006.01) |
| H01S 5/40 | (2006.01) |

(52) U.S. Cl.
CPC ...... H01S 5/02407 (2013.01); G06K 15/1209 (2013.01); H01S 5/0427 (2013.01); H01S 5/4043 (2013.01)

(58) Field of Classification Search
CPC .. H01S 5/02407; H01S 5/0427; H01S 5/4043; G06K 15/1209

USPC .......................................................... 372/34
See application file for complete search history.

(56) References Cited

U.S. PATENT DOCUMENTS

| 4,193,380 | A | * | 3/1980 | Marchak ............... F02D 41/266 123/491 |
| 4,682,876 | A | | 7/1987 | Ohtsuka et al. |
| 5,410,339 | A | * | 4/1995 | Bisaiji ...................... B41J 2/471 347/140 |
| 5,651,017 | A | | 7/1997 | Genovese |
| 6,219,084 | B1 | * | 4/2001 | Van Uffel .......... G06K 15/1214 347/132 |
| 6,370,175 | B1 | * | 4/2002 | Ikeda ................. H04N 1/40037 347/236 |
| 6,634,556 | B2 | | 10/2003 | Courtney et al. |
| 8,897,667 | B2 | | 11/2014 | Yamanaka et al. |

(Continued)

FOREIGN PATENT DOCUMENTS

WO    WO-1993018563 A1    9/1993

OTHER PUBLICATIONS

Goldwasser, S. M., "Cooling of Laser Diodes", (Web Page) <http://www.repairfaq.org/sam/laserdio.htm >.

*Primary Examiner* — Tuan N Nguyen
(74) *Attorney, Agent, or Firm* — Mannava & Kang

(57) ABSTRACT

A method of controlling a laser unit in order to negate heat build-up caused by a laser modulation current, and eliminating artifacts caused by image related thermal effects. Upon receipt of an activation signal, an activation current is applied which causes lasing of the laser unit. Upon receipt of a deactivation signal, the method ceases lasing by selectively applying either an idle current below the activation current, or a cooling current below the idle current.

20 Claims, 13 Drawing Sheets

(56) References Cited

U.S. PATENT DOCUMENTS

2009/0079358 A1     3/2009    Shteynberg et al.
2010/0119246 A1     5/2010    Kim
2015/0293493 A1    10/2015    Sue

* cited by examiner

LASER UNITS

BACKGROUND

Laser Scanning Units (LSU) employed in printing systems directly scan a laser over a negatively charged cylinder called a "drum" to define differentially charged areas representing text or images. In some examples, a belt, or other configurations are used in place of or in addition to the drum. Electrically charged printing fluid, for example liquid ink or powdered ink (toner), is then selectively applied to the drum and transferred to the print medium. The intensity of the laser, which affects the size and amount of toner transferred to the drum, is controlled by modulating the current provided to the laser diode in a laser unit.

The modulation current causes temperature fluctuations in the laser diode. Whilst laser units often include temperature stabilization systems comprising temperature sensors and thermoelectric coolers, the temperature control is generally significantly slower than the modulation data dependant heat changes.

DETAILED DESCRIPTION

The present disclosure provides a method for negating image-dependent thermal effects caused by temperature variations in an LSU, and therefore eliminates artifacts caused by image related thermal effects. Whilst the examples discussed herein deal predominantly with printing units, the following methods may be employed by any burst laser system (i.e. non-continuously active/lasing/modulating systems).

Figure 1:
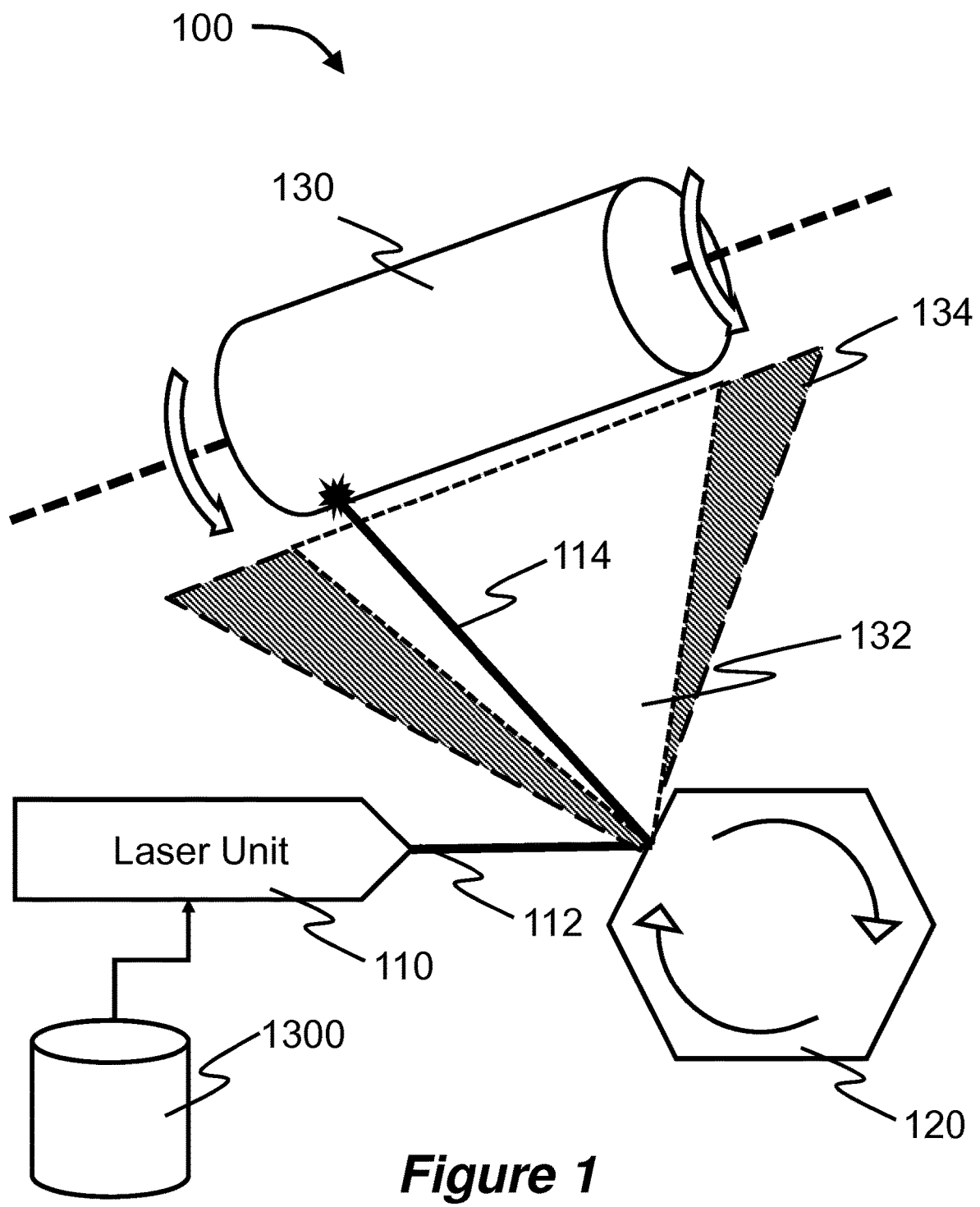
FIG. 1 shows a simplified example of a laser scanning unit.

FIG. 1 shows an example laser scanning unit 100, comprising a laser unit 110 emitting a laser beam 112. In the example shown, the laser unit 110 is controlled by a processor, the processor being adapted to access and execute instructions encoded on a non-transitory machine-readable storage medium 1300. Further details of the non-transitory machine-readable storage medium and the instructions encoded therein are discussed below in relation to FIG. 13. FIG. 1 also shows a rotating, reflective polygon 120, which reflects/deflects the incoming laser beam 112 from the laser unit 110 towards a rotating photo imaging plate ("PIP") cylinder 130. As the sides of the polygon 120 rotate, the angle of reflection/deflection of the incoming laser beam 112 changes, and the reflected/deflected laser beam 114 "scans" across the face of the PIP 130, transferring digital data to the PIP by neutralizing a pre-deposited charge in those areas. As the PIP 130 rotates, it carries a latent image in the form of an invisible electrostatic charge pattern conforming to the image or text to be printed. However, the reflected/deflected laser beam 114 is scanned over an area greater than the face of PIP 130. Whilst the laser 114 is reflected/deflected onto the face of PIP 130, it is said to be "on-scan", shown in FIG. 1 as the inner area 132. Data/charge is transmitted to the PIP 130 during the "on-scan" period. When the laser 114 is reflected/deflected off of the face of PIP 130, it is said to be "off-scan", shown in FIG. 1 as the outer area 134. No data/charge is transferred to the PIP 130 during the "off-scan" period.

In one example, the "off-scan" period of the LSU is used to counteract any temperature fluctuations caused by the "on-scan" period lasing activity, including any residual thermal artifacts from previous "on-scan" periods. Some examples described herein analyse the digital data inputted into the laser unit 110, and in combination with known laser unit parameters, are able to effectively maintain a more stable operating temperature of the laser diode in the laser unit 110, therefore providing greater print quality. In some examples, the laser unit comprises multiple laser diodes.

Laser emission from a laser unit is controlled by modulating the input current. Laser systems that operate in "burst" mode, such as those found in laser printing systems, generally have two states:
i) An idle-state (or off-state), where no modulation data is transmitted to the laser unit. The current provided to the laser diode state is referred to as the idle current, and the corresponding energy as the idle energy. The laser diode is maintained at a constant idle current level. In some examples, this idle current is below the lasing threshold current and the laser is off, i.e. does not emit light; and
ii) An active-state (or on-state), where modulation data is transmitted to the laser unit, modulating (i.e. varying) the current above the lasing threshold, causing light emission. The modulated current adjusts the intensity of the emitted light. The current provided to the laser diode state is referred to as the activation current, and the corresponding energy as the activation energy.

In a laser printing unit, the idle current is applied when no pixel is to be printed. The active current is applied to generate pixels with desired characteristics (e.g. dot area). In one example, the laser modulation current is digitally controlled by converting the digital pixel data to laser currents in a digital to analogue converter ("DAC"—see FIG. 10). In an alternative example, the laser modulation current is controlled with a switch.

Whilst the activation energy is partially emitted as light energy in the laser beam, the rest is converted into heat energy. It is this modulation data dependent heat energy that causes the laser diode junction temperature to rise, leading to print artefacts. The amount of heat energy depends on the specific laser parameters (efficiency, threshold, etc.), and the activation current provided to the laser unit. Therefore, whilst the activation energy is applied to the laser unit, heat energy is accumulated at the laser diode. When the idle current is applied, i.e. the laser is switched off, heat energy is dissipated.

Figure 2:
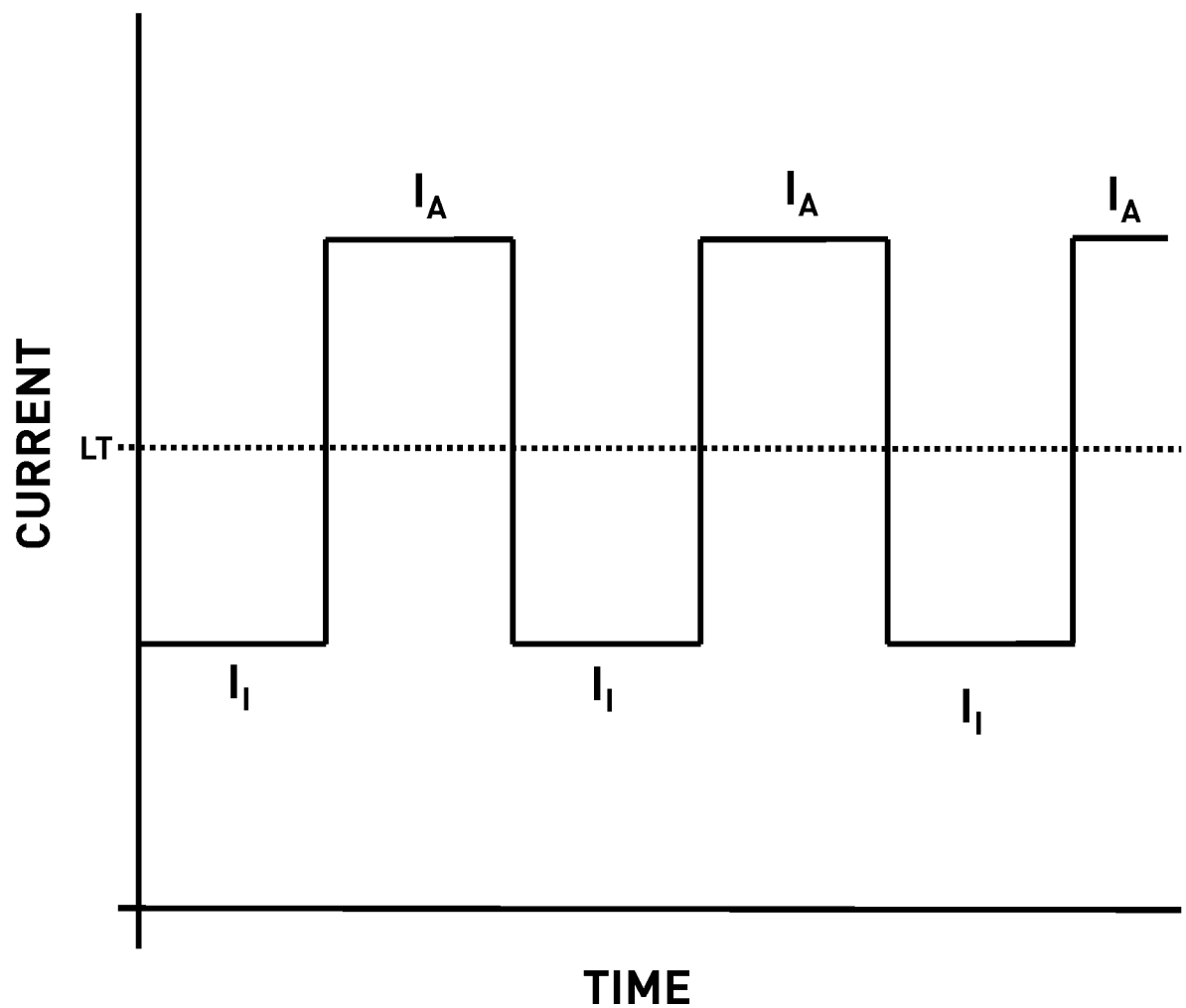
FIG. 2 shows a simplified example laser control current graph.
Figure 3:
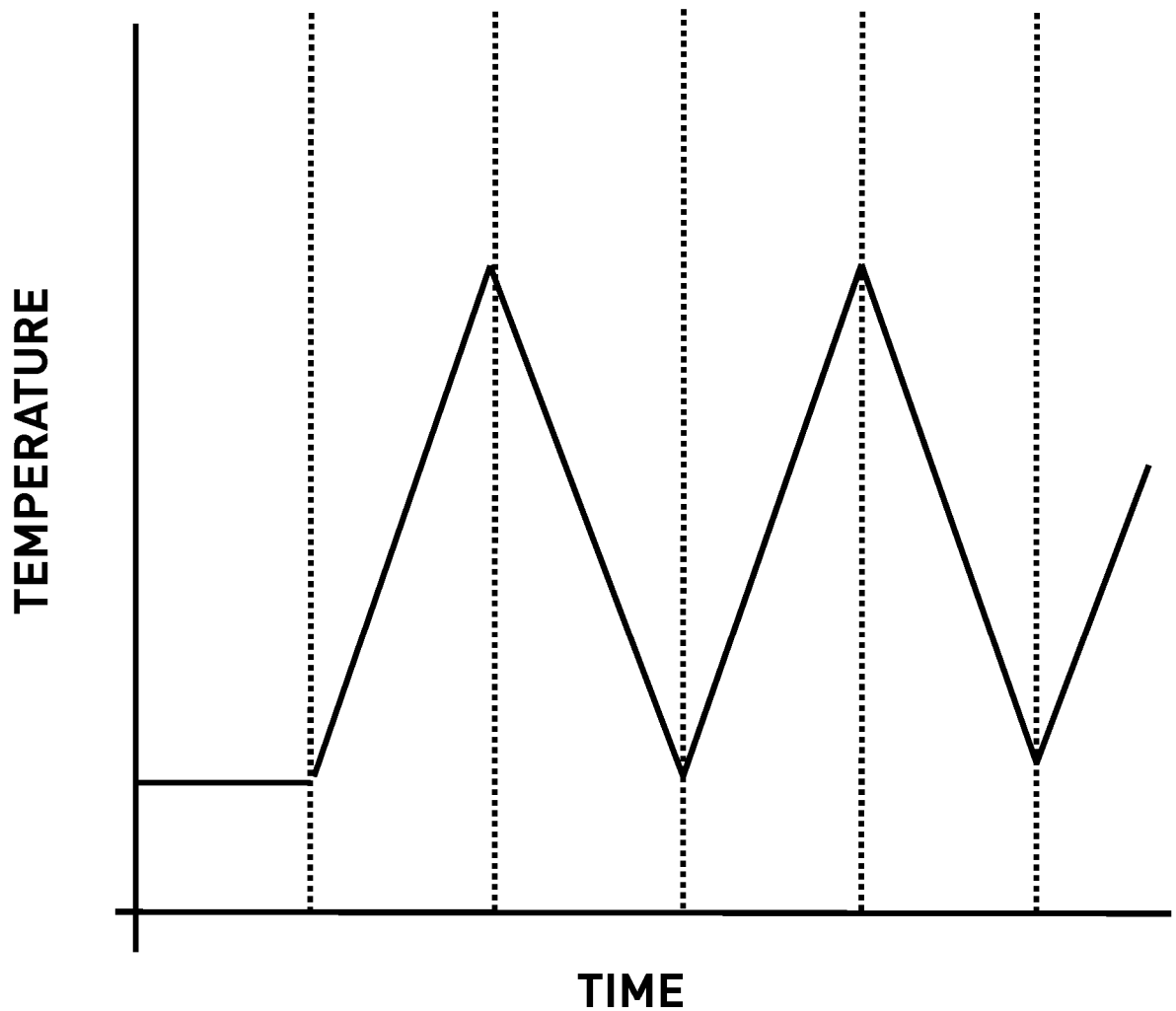
FIG. 3 shows a simplified example laser diode temperature graph according to FIG. 2.

FIG. 2 shows an example control current provided to a laser unit. In response to receiving an activation signal, an activation current ($I_A$) is applied to the laser unit. In response to receiving a deactivation signal, an idle current ($I_I$) is applied. In the example shown, and in response to receiving the corresponding signals, the current then oscillates between a constant activation current ($I_A$) above the lasing threshold (LT) and a constant idle current ($I_I$) below the lasing threshold (LT). This causes the laser unit to emit light on and off in pulses. FIG. 3 shows an example temperature graph of a laser diode receiving the current shown in FIG. 2. When the activation current ($I_A$) is applied, the temperature of the laser diode increases. When the lower, idle current ($I_I$) is applied, the temperature of the laser diode falls.

Figure 4:
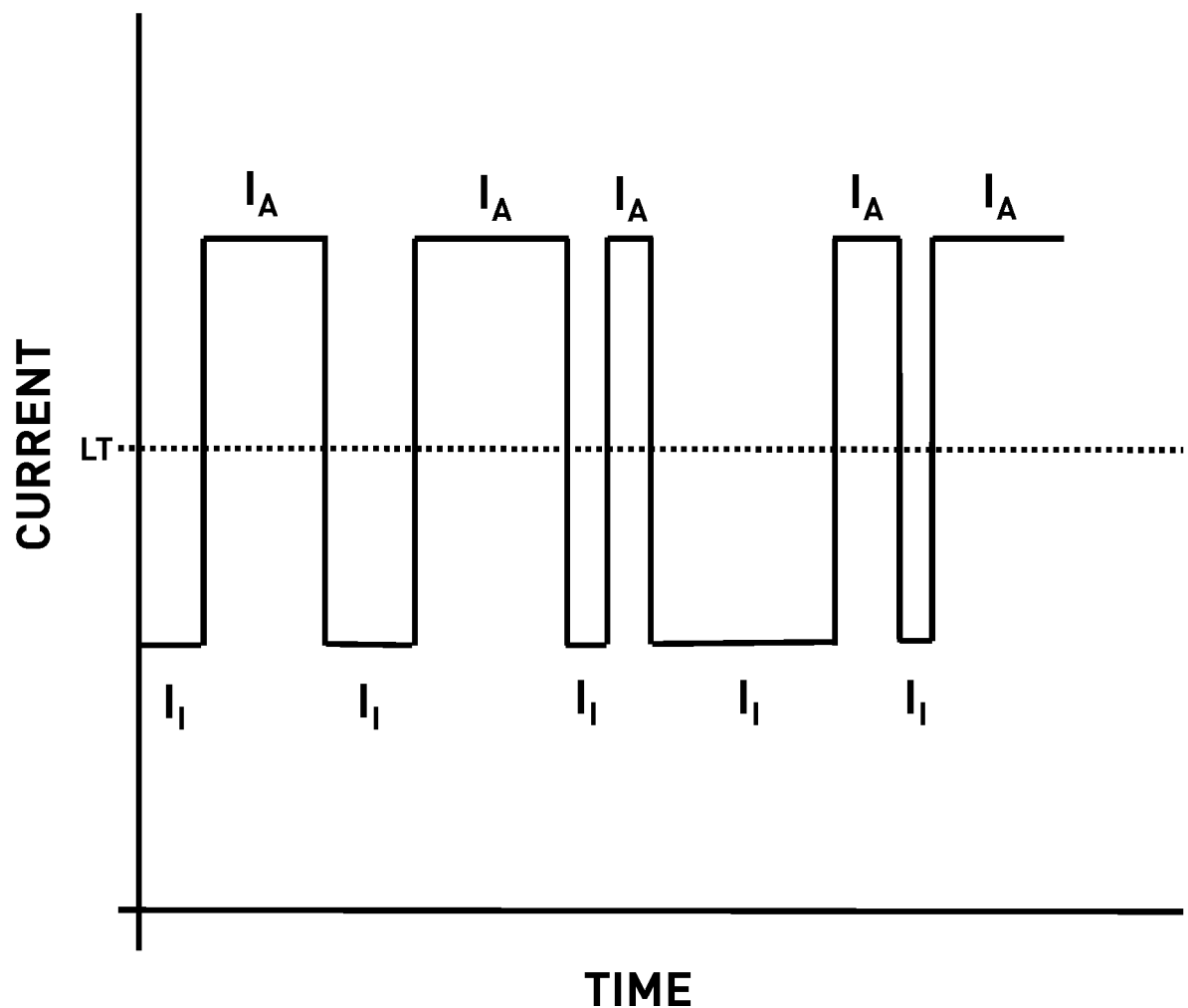
FIG. 4 shows another simplified example laser control current graph.
Figure 5:
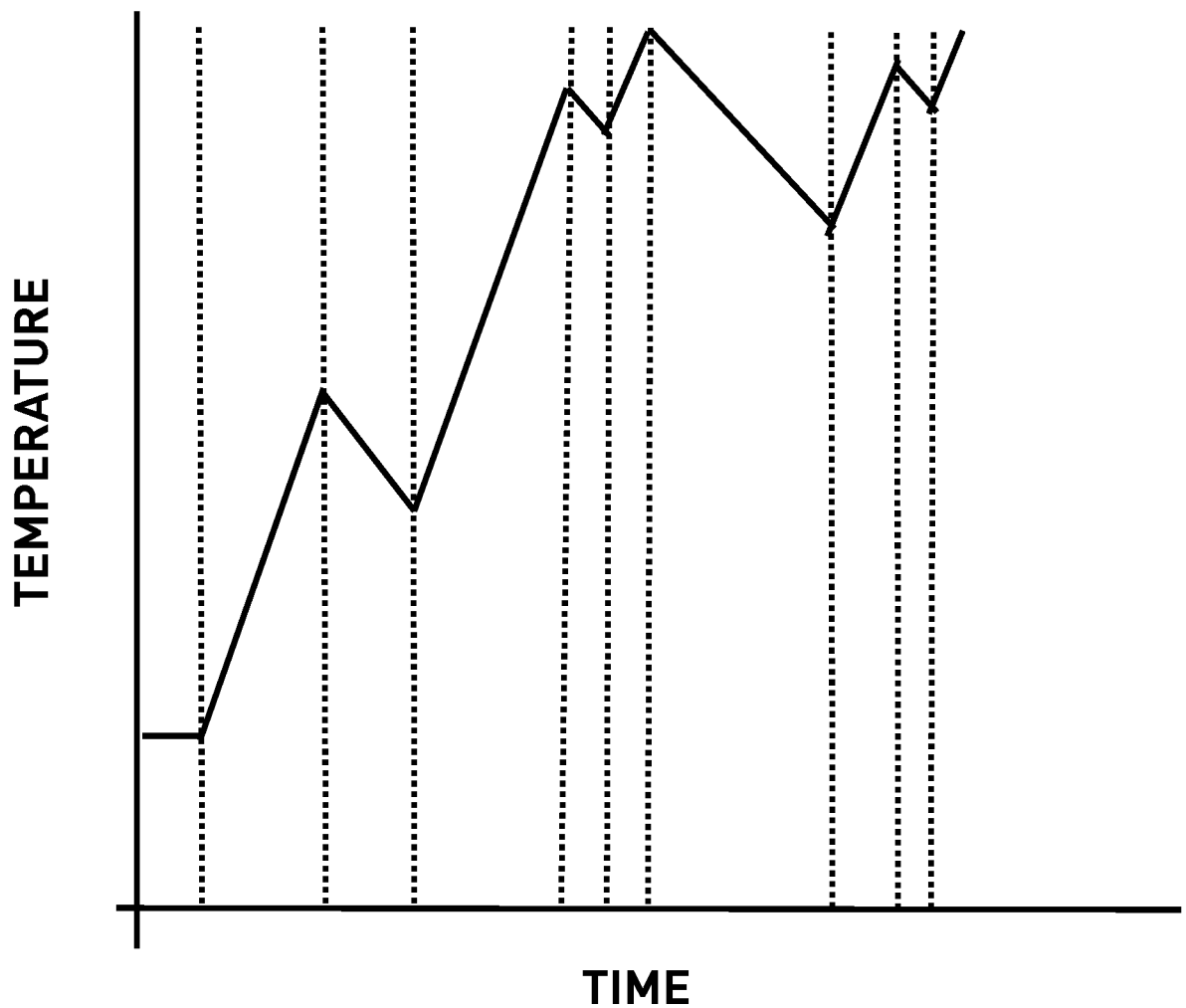
FIG. 5 shows another simplified example laser diode temperature graph according to FIG. 4.

However, the example shown in FIG. 2 is a simplified example. In a different situation with a varying activation current (e.g. of different magnitude) and varying activation pulse timings, temperature variations occur, which can lead to undesirable print artifacts. FIG. 4 shows an example where the active and idle periods of the corresponding active and idle currents provided to a laser unit are not equal (as in FIG. 2). Owing to the longer activation periods, the laser unit does not have enough time to fully cool down after each burst and the average temperature of the laser diode rises over time, as shown in FIG. 5. Temperature variation in the laser diode may also be caused by modulating the activation current above the lasing threshold, compared to a constant idle current (below the lasing threshold). An increased activation current will increase the rate at which heat energy is accumulated by the laser diode during active lasing periods.

In order to address temperature variance in the laser diode, the "inactive" current is also controlled in an effort to negate the heat energy accumulated whilst an activation current (modulated or constant) is applied.

Stabilization of the laser diode temperature is achieved by maintaining a more constant average laser (heat) energy over time, which for simplicity, may be selected to be the energy provided by the idle current.

The present disclosure employs a third current level in the form of a cooling current, lower than the standard idle current. The cooling current is a temporary laser energy reduction, allowing the laser diode to cool faster than when the idle current is applied in an effort to dissipate the heat energy accumulated by the laser diode during activation periods. The amount of heat energy dissipated whilst the cooling current is applied is proportional to the difference between idle current and the cooling current.

In one example, during the on-scan period (whilst the deflected/reflected laser beam 114 is targeted at the rotating PIP 130 within area 132), in response to receiving an activation signal, an activation current ($I_A$) is applied to the laser unit, causing lasing of the laser unit (i.e. emission of laser). In one example, the activation current ($I_A$) applied in response to receiving an activation signal is variable above the lasing threshold (LT) of the laser unit. In the example shown in FIG. 6, the activation current ($I_A$) has a constant value.

When the on-scan period ends (e.g. the rotating polygon no longer reflects/deflects the laser 112, 114 towards the PIP 130), and in response to receiving a deactivation signal, certain examples selectively apply either the idle current ($I_I$) (below the activation current ($I_A$)), or a cooling current ($I_c$) having a value below the idle-current ($I_I$). In one example, the idle current ($I_I$) selectively applied in response to receiving a deactivation signal is a constant current. In another example, cooling current ($I_c$) selectively applied in response to receiving a deactivation signal is a constant current. However it is envisioned that in other examples either or both of the idle current ($I_I$) and the cooling current ($I_c$) may be variable.

Figure 6:
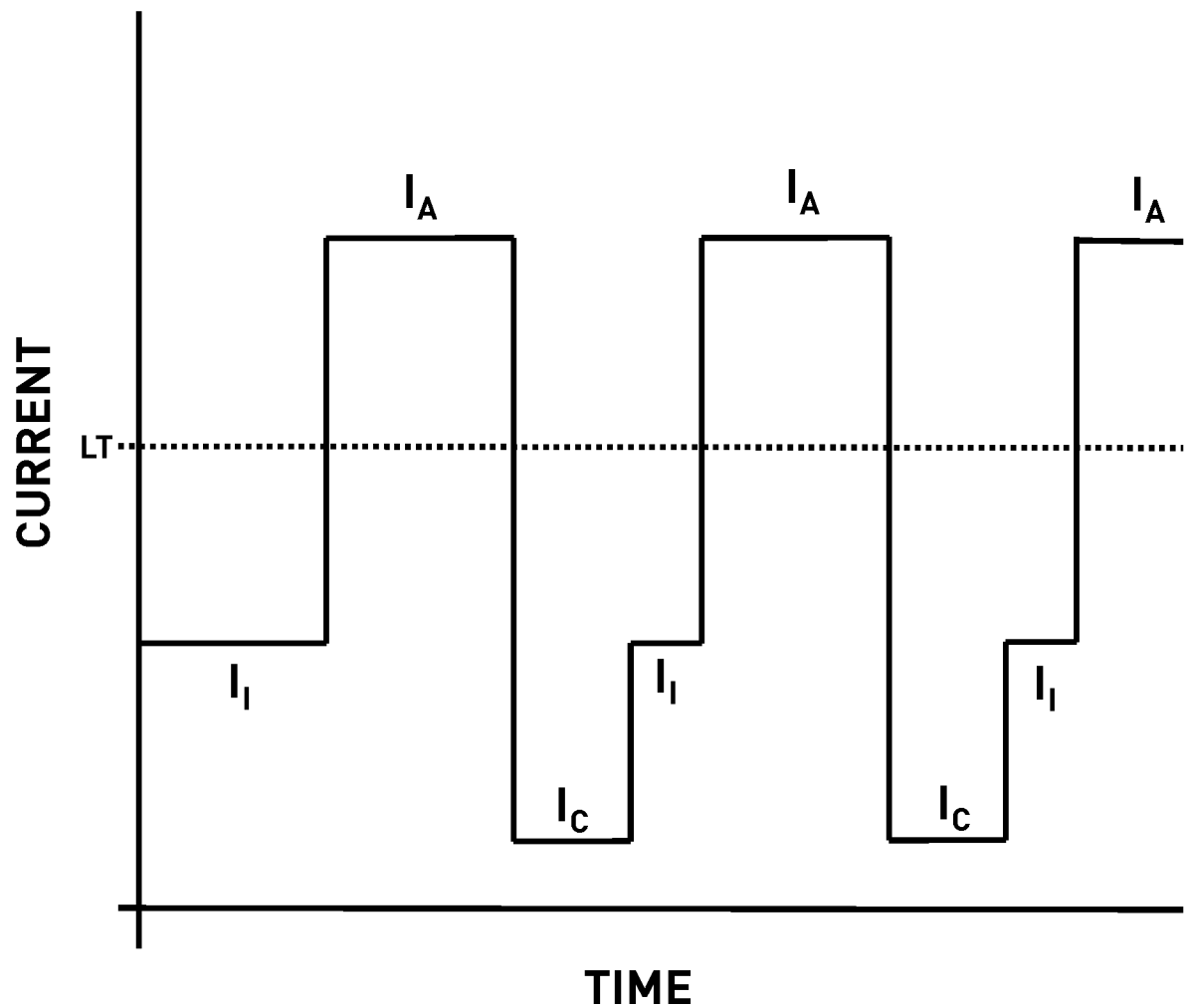
FIG. 6 shows another simplified example laser control current graph.
Figure 7:
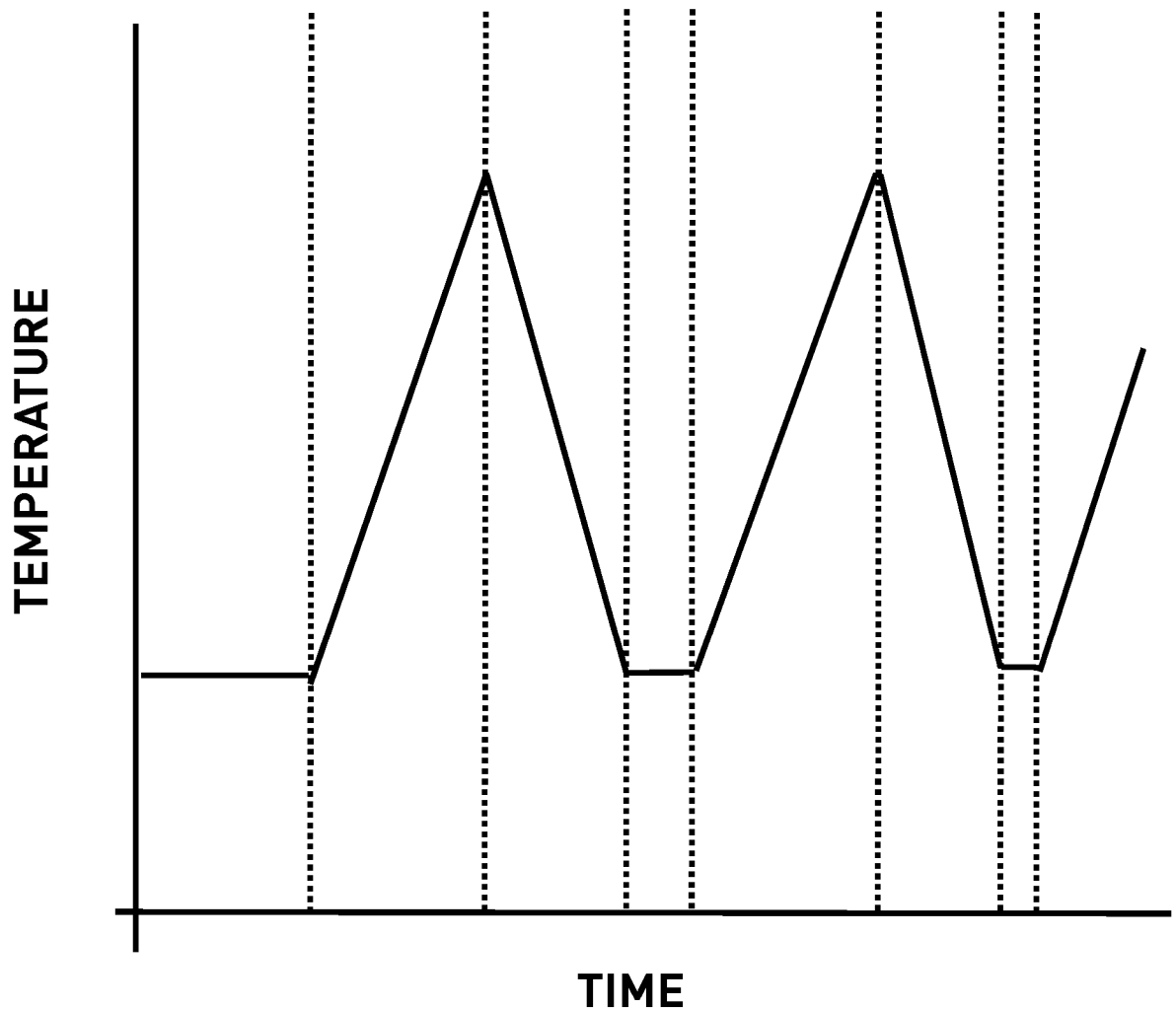
FIG. 7 shows another simplified example laser diode temperature graph according to FIG. 6.

In the example shown in FIGS. 6 & 7, the cooling current ($I_c$) is applied to the laser unit during the "off-scan" period until the heat energy accumulated during the "on-scan" period is effectively negated. Once the heat energy is negated (i.e. the heat energy accumulated is balanced by the heat energy dissipated) the idle current ($I_I$) may be applied to maintain a stable temperature.

Figure 8:
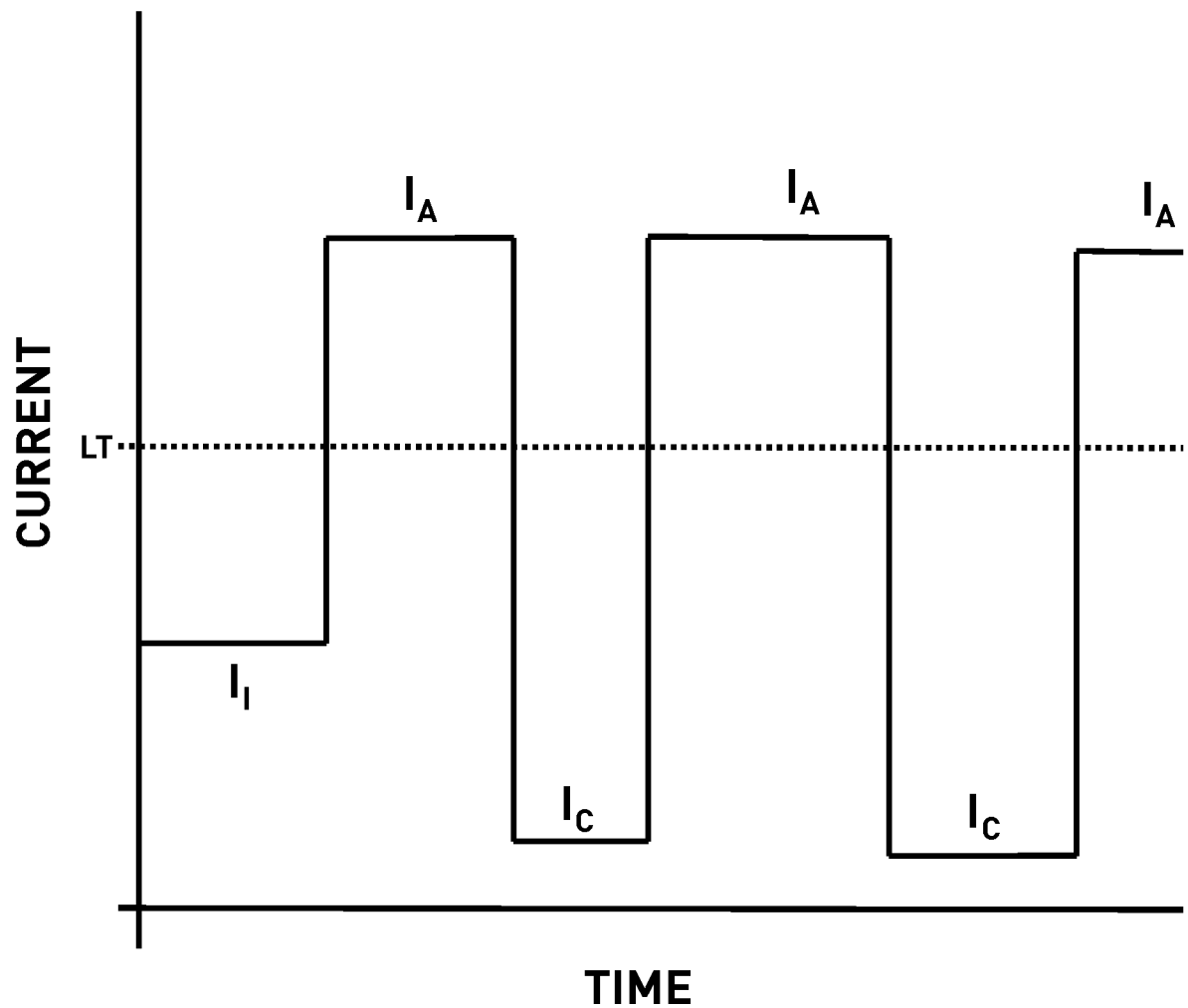
FIG. 8 shows another simplified example laser control current graph.
Figure 9:
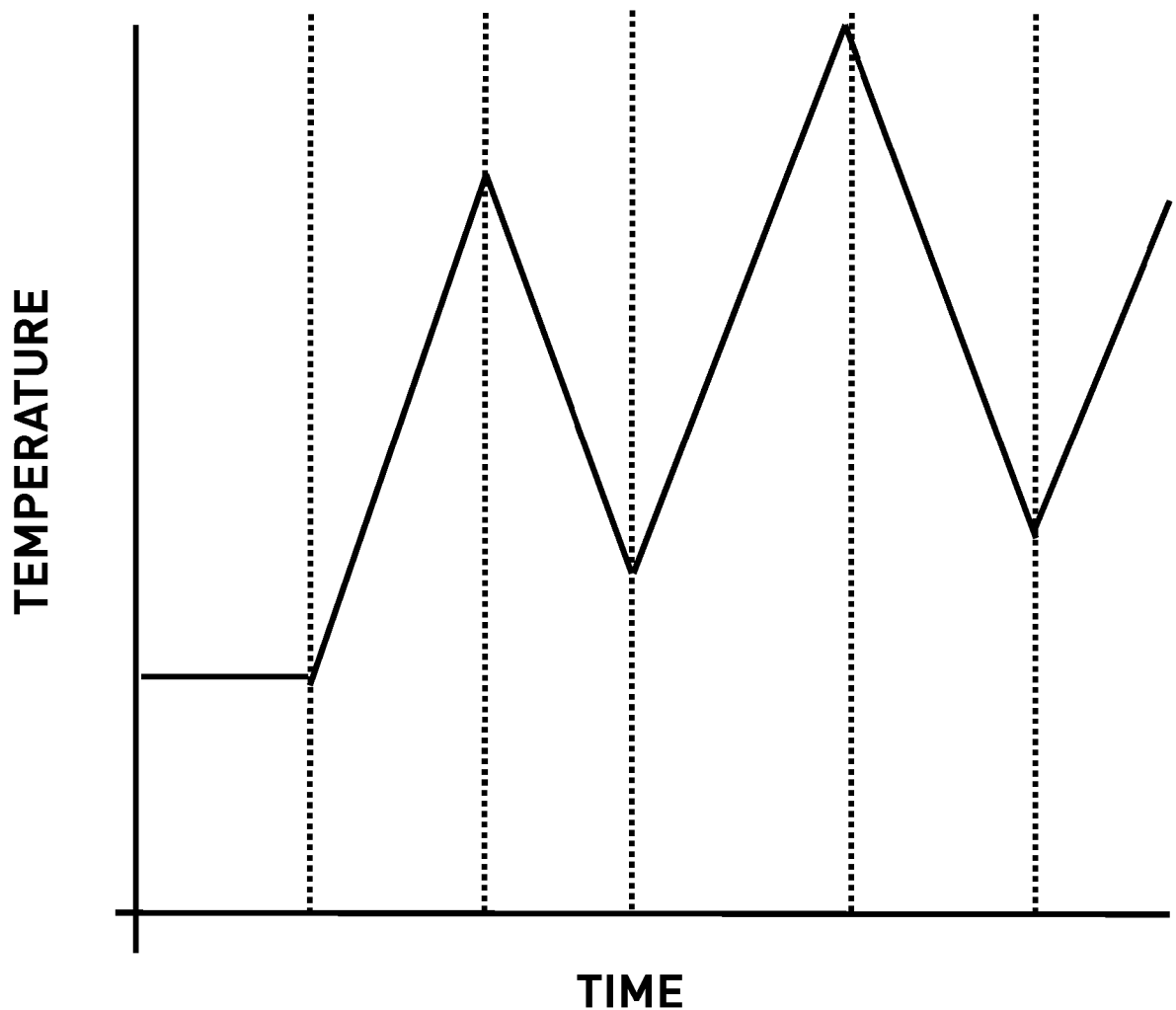
FIG. 9 shows another simplified example laser diode temperature graph according to FIG. 8.

However, in the example shown in FIGS. 8 & 9, in response to receiving a further activation signal after the selective application of the cooling current ($I_c$), an activation current ($I_A$) is re-applied, causing lasing of the laser unit. Therefore, if an activation signal is sent to the laser before the heat energy is fully dissipated (e.g. the next "on-scan" period arrives), the laser unit activates immediately, and any remaining heat energy remains in the laser system to be dissipated later.

In the example shown in FIGS. 6 & 7, the cooling current ($I_c$) selectively applied in response to receiving a deactivation signal is applied immediately after receiving the deactivation signal. The cooling current ($I_c$) is applied to the laser unit if there is a positive amount of accumulated heat energy. In an example wherein there is no accumulated heat energy (or a pre-determined low amount) when the deactivation signal is received, then some examples will involve applying the idle current ($I_I$) straight away—as seen in FIG. 2.

The present disclosure may be implemented as an "open loop" system, i.e. does not employ feedback to determine if its output has achieved the desired effect, e.g. measuring the diode laser junction temperature or output light intensity. Instead, in some examples, the system calculates the amount of heat energy in the system, and applies the cooling current until the heat is balanced by the energy dissipated.

During the active state (on-state) whilst the (constant or modulated) activation current ($I_A$) is applied, the heat energy accumulated by the laser is monitored, and in one example the selective application of either the idle current ($I_I$) or the cooling current ($I_c$) is carried out at least on the basis of the monitored accumulated heat energy. In another example monitoring of the heat energy accumulated during application of the activation current ($I_A$) comprises calculating:
the energy provided by the activation current ($I_A$);
the inputted idle energy provided by the idle current ($I_I$); and
the energy emitted by the laser.

The heat energy accumulated during application of the activation current ($I_A$) is found by calculating the difference between the monitored energy provided by the activation current ($I_A$) and the sum of the monitored energy provided by the idle current ($I_I$) and the energy emitted by the laser, and the selective application of either the idle current ($I_I$) or the cooling current ($I_c$) is carried out at least on the basis of this calculation.

The pixel digital data, driving the laser activation current, can be entered into such a calculation to calculate the heat generated and accumulated during the active part of the scan. However, more advanced formulas may also be employed in order to calculate the accumulated heat energy. In one example, the monitoring of the heat energy accumulated by the laser whilst the activation current is applied comprises monitoring any residual heat energy from previous activation periods, i.e. any residual heat energy not wholly negated by the previous cooling period.

During the cooling state, i.e. whilst the cooling current ($I_C$) is applied, the heat energy dissipated by the laser is monitored, and in one example the selective application of either the idle current ($I_I$) or the cooling current ($I_c$) is carried out at least on the basis of the monitored dissipated heat energy.

In an example, in response to receiving a deactivation signal, the cooling current ($I_C$) is applied immediately after receiving the deactivation signal, the heat energy accumulated by the laser whilst the activation current ($I_A$) was applied is monitored, and the heat energy dissipated by the laser whilst the cooling current is applied is monitored. In response to the dissipated heat energy balancing the accumulated heat energy, the idle current ($I_I$) is applied after application of the cooling current ($I_C$).

In one example, the heat energy dissipated during application of the cooling current ($I_C$) is monitored by monitoring the energy provided by application of the idle current ($I_I$) and the energy provided by application of the cooling current ($I_C$). The difference between the monitored energy provided by the idle current and the monitored energy provided by the cooling current is calculated, and the selective application of either the idle current ($I_I$) or the cooling current ($I_c$) is carried out on the basis of this calculation.

The difference between the idle energy provided whilst the idle current is applied and the cooling energy provided whilst the cooling current is applied, is the dissipated heat energy. As long as the accumulated heat value is positive, the dissipated heat energy is subtracted from the calculated accumulated heat energy until a balanced (i.e. zero accumulated heat energy) heat energy level is reached. Once the accumulated and dissipated heat energies are balanced, the idle current is applied to maintain a steady temperature.

Therefore, in examples, the increase in laser diode temperature during active lasing periods, is balanced by proportional cooling during idle times. The average heat energy is maintained constant, and therefore the laser diode junction temperature is also around a constant steady state, instead of being dependent upon the laser activation activity.

Figure 10:
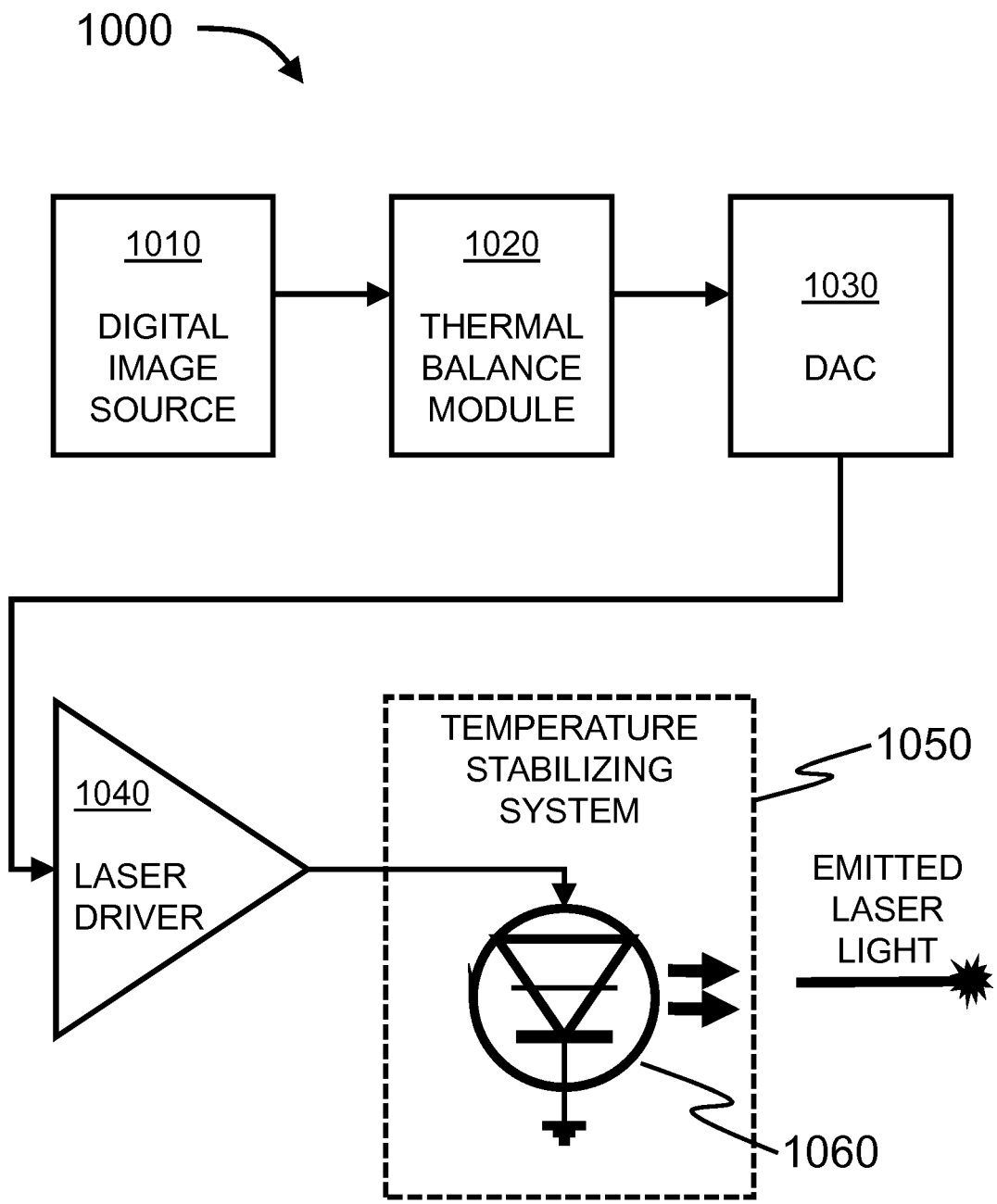
FIG. 10 shows a schematic circuit diagram of an example laser unit.
Figure 11:
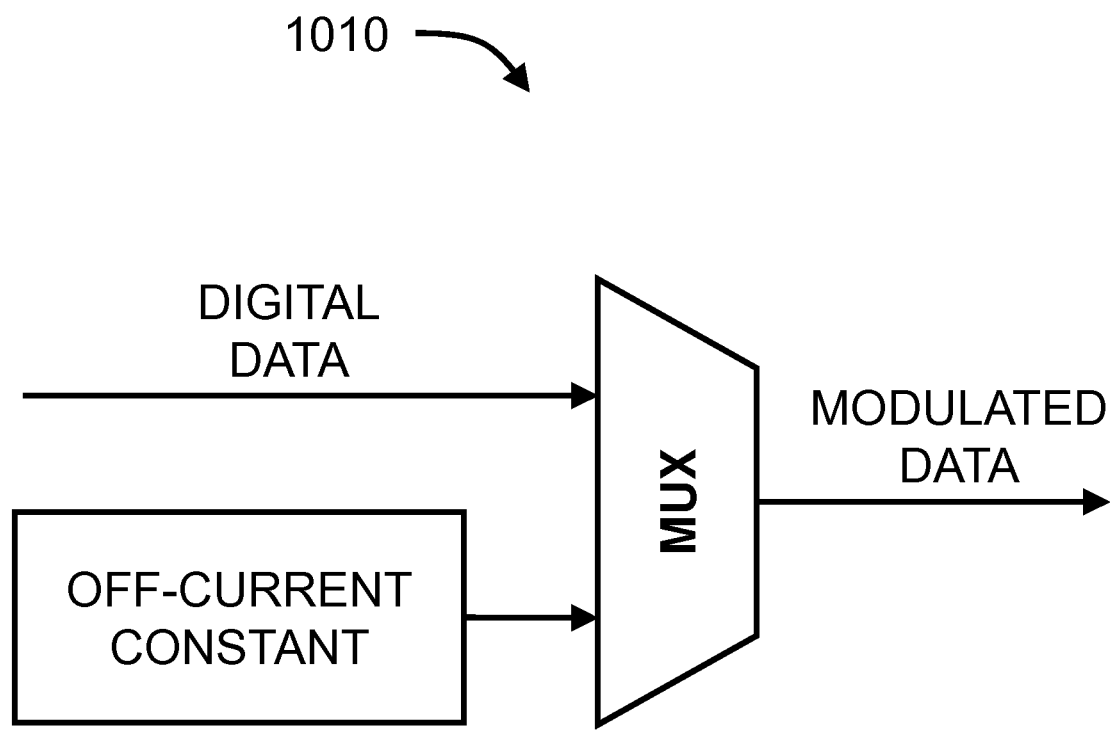
FIG. 11 shows a schematic circuit diagram of an example digital image source as shown in FIG. 10.
Figure 12:
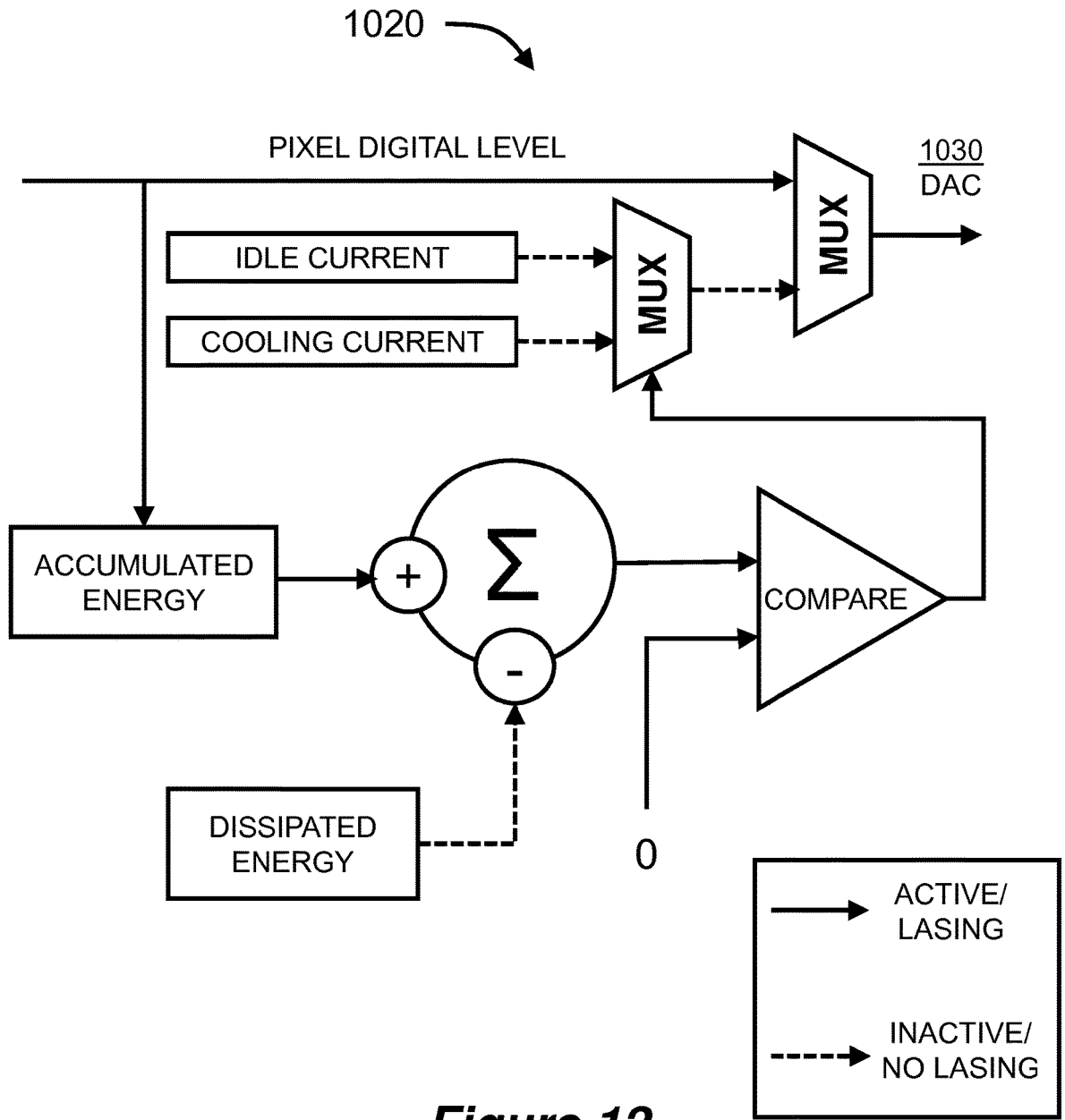
FIG. 12 shows a schematic circuit diagram of an example thermal balance module as shown in FIG. 10.

FIGS. 10 to 12 show components of a laser unit according to examples.

As seen in FIG. 10, the example laser unit 1000 comprises a digital image source 1010, a thermal balance module 1020, a digital to analogue converter (DAC) 1030; a laser driver 1040 and a laser diode 1060. The laser unit 1000 may also incorporate a further temperature stabilization system 1050 incorporating a temperature sensor and thermoelectric cooler for countering large scale temperature changes.

FIG. 11 shows the components of an example digital image source 1010 in more detail, wherein the digital image source 1010 receives digital data (e.g. pixel data to be printed) and inputs it into a multiplexer (MUX) with two inputs: the digital data itself; and an off-current constant. In one example received digital data is considered to be an activation signal, and the absence of inputted data is considered to be a deactivation signal. The digital image data source 1010 outputs either modulated data or an off-current to the DAC 1030 via the thermal balance module 1020.

FIG. 12 shows the components of the thermal balance module 1020 in more detail. In one example, the off-current constant in the digital image source 1010 is provided directly by the thermal balance module 1020. The thermal balance module 1020 receives either modulated data or an off-current from the digital image source 1010. In response to the laser unit 1000 receiving an activation signal (therefore causing lasing of the laser unit), the heat energy accumulated by the laser diode whilst an activation current is applied to the laser is monitored. As long as the digital image source 1010 is providing modulated data to the balance module 1020, the balance module outputs an active lasing signal (i.e. an activation current above the lasing threshold) modulated in accordance with the pixel data, to the DAC 1030.

The DAC 1030 converts digital data from the digital image source 1010 and thermal balance unit 1020 into an analogue signal for the laser driver 1040 which feeds directly to the laser diode 1060 which emits laser light.

However, in response to the laser unit receiving a deactivation signal (when no modulated data is received from the digital image source 1010, i.e. the laser is inactive), the thermal balance unit 1020 outputs either an idle current ($I_I$) or a cooling current ($I_C$) to the DAC 1030, deactivating the laser diode 1060. In the example wherein the cooling current ($I_C$) is applied, the thermal balance module 1020 monitors the heat energy dissipated from the laser diode whilst the cooling current is applied ($I_C$). The thermal balance unit 1020 subtracts the dissipated heat energy from the accumulated heat energy, and as long as this value is greater than zero, the cooling current will be outputted to the laser DAC 1030. However, if the dissipated heat energy balances the accumulated heat energy, then the idle current ($I_I$) is applied to the laser diode (i.e. outputted to the laser DAC 1030).

The inactive period of the laser may be between scans in an LSU, or in another example could be between active pixel imaging during the on-scan period.

Figure 13:
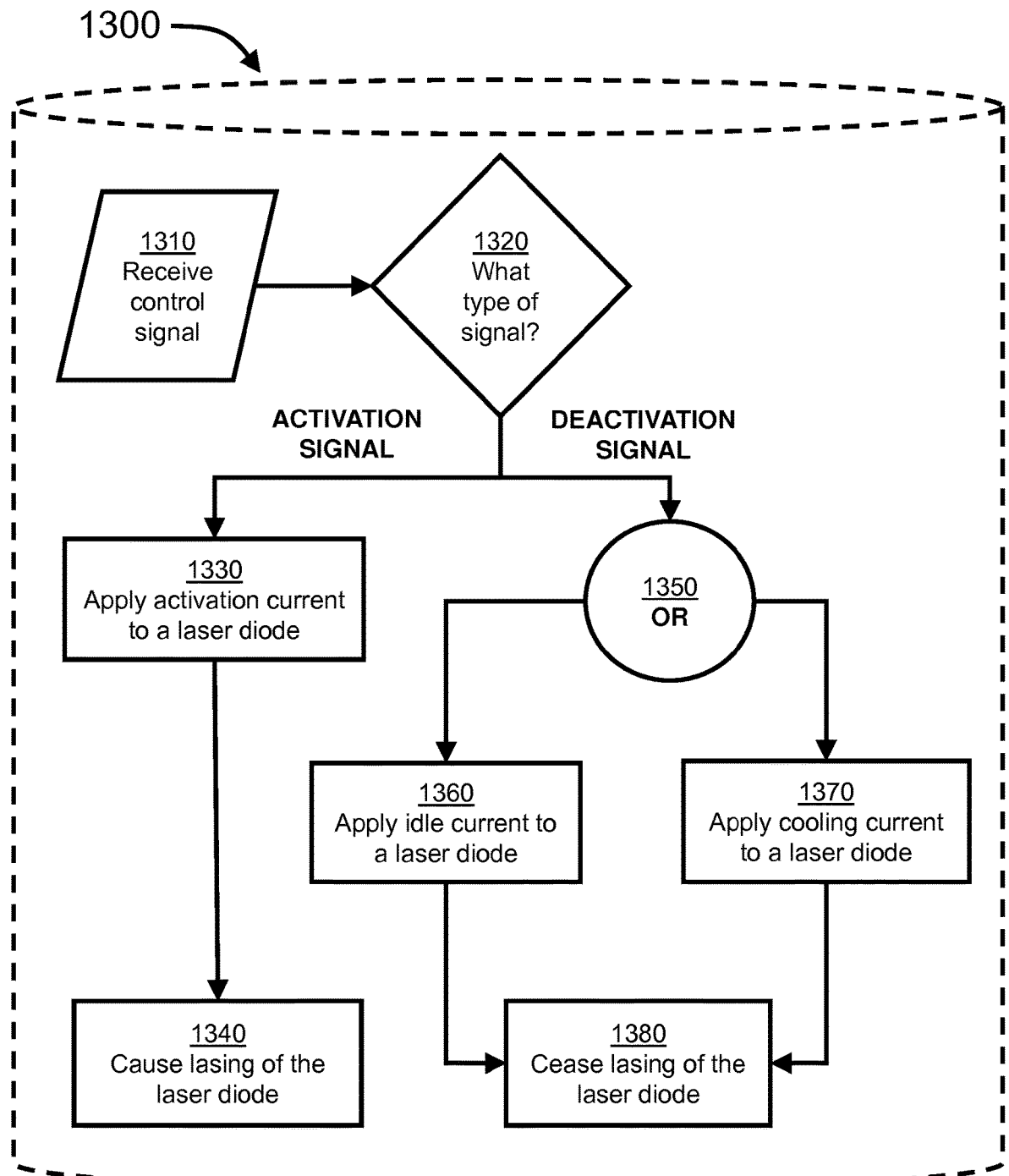
FIG. 13 shows an example of a non-transitory machine-readable storage medium encoded with instructions executable by a processor.

In another example, and as shown in FIG. 13, there is provided a non-transitory machine-readable storage medium 1300 encoded with instructions executable by a processor. The instructions, when executed and in response to receiving an activation signal (blocks 1310; 1320), cause an activation current to be applied to a laser diode (block 1330), which causes lasing of the laser diode (block 1340). In response to receipt of a deactivation signal (blocks 1310; 1320), the instructions cause the selective application (block 1350) of either an idle current below the activation current (block 1360), or a cooling current below the idle current (block 1370) to the laser diode, which ceases lasing of the laser diode (block 1380).

In some examples, the selective application (block 1350) of either an idle current below the activation current (block 1360), or a cooling current below the idle current (block 1370) to the laser diode is dependent upon the amount of accumulated heat energy in the laser diode. In one example, if there is a positive amount of accumulated heat energy, the cooling current is selectively applied to the laser diode after receiving the deactivation signal. If there is no accumulated heat energy (or a pre-determined low amount) when the deactivation signal is received, then some examples will involve selectively applying the idle current to the laser diode.

The above examples are to be understood as illustrative examples. Further examples are envisaged. For example, instead of applying a constant cooling current for a variable amount of time determined by the image data, a variable cooling current may be applied for a constant amount of time at a determined by the image data. This example may perform less thermal cycling on the laser, possibly increasing laser life time when compared to other examples disclosed herein.

In another example, in an attempt to maintain a steady laser diode temperature, instead of using the off-scan period of an LSU to reduce the laser diode temperature to the steady level provided by the idle current, the laser is activated during the off-scan period (i.e. when not deflected/reflected towards the PIP 130) to bring the average energy (and therefore laser diode temperature) up to the maximum on-state value.

Whilst the deflected/reflected laser beam 114 is directed outside of the PIP 130 between on-scan periods, the laser is activated in order to print an 'inverted' image in the margins of the full scan area. For example, for each image pixel printed during the on-scan period (i.e. when the laser is deflected/reflected towards the PIP 130) a corresponding inverted pixel is printed in the off-scan period with an intensity corresponding to the difference between the on-scan period pixel and the max-level intensity.

For example, for any pixels not printed during the on-scan period, the corresponding inverted pixel printed during the off-scan period will involve using the maximum activation energy available to emit the maximum laser intensity. For any pixels printed with maximum intensity during the on-scan period, no pixel is printed during the off-scan period. For any pixel printed with sub max intensity during the on-scan period, a corresponding pixel is printed during the off-scan period with an intensity equivalent to the difference between the on-scan pixel and the maximum intensity. This example offers a simpler solution, and can be achieved more easily. However, the laser energy employed is much higher, equivalent to printing 100% of the time image on (instead of image-off), resulting in higher laser diode temperature and possibly decreasing laser life time.

The disclosed examples are suitable for "open-loop" operation, with no feedback data from the laser, e.g. temperature or light intensity readings. Feedback may be used for improved accuracy.

Examples herein disclose the activation current ($I_A$) being applied during "on-scan" periods of an LSU in which the laser unit is comprised, and/or where the cooling current ($I_C$) is applied during "off-scan" periods of an LSU in which the laser unit is comprised. However, other examples may also be implemented wherein the cooling current ($I_C$) is applied during the "on-scan" period between active lasing of pixels, i.e. applying the cooling current ($I_C$) in the gaps between individual active pixel date during the on-scan period in order to negate heat build-up from individual pixel lasing activity.

It is to be understood that any feature described in relation to any one examples may be used alone, or in combination with other features described, and may also be used in combination with one or more features of any other of the examples, or any combination of any other of the examples. Furthermore, equivalents and modifications not described above may also be employed without departing from the scope of the present disclosure, which is defined in the accompanying claims.

The invention claimed is:

1. A method of controlling a laser unit, the method comprising:
   in response to receiving an activation signal, applying an activation current which causes lasing of the laser unit;
   monitoring accumulated heat energy by the laser whilst the activation current is applied; and
   in response to receiving a deactivation signal, selectively applying either:
   an idle current below the activation current; or
   a cooling current below the idle current, wherein the selectively applying is carried out at least on the basis of the monitoring of the accumulated heat energy.

2. A method according to claim 1, comprising monitoring the heat energy dissipated by the laser whilst the cooling current is applied,
   wherein the selectively applying is carried out at least on the basis of the monitoring of the dissipated heat energy.

3. A method according to claim 2, wherein the monitoring of the heat energy dissipated during application of the cooling current comprises monitoring:
   energy provided by application of the idle current; and
   energy provided by application of the cooling current,
   the method further comprising calculating a difference between the monitored energy provided by the idle current and the monitored energy provided by the cooling current, and wherein the applying the idle current is carried out based on the difference.

4. A method according to claim 1, wherein the activation current applied in response to receiving an activation signal is variable above a lasing threshold of the laser unit.

5. A method according to claim 1, wherein the idle current is a constant current.

6. A method according to claim 1, wherein the cooling current is a constant current.

7. A method according to claim 1, wherein the cooling current is applied immediately after receiving the deactivation signal.

8. A method according to claim 7, comprising:
   monitoring the heat energy accumulated by the laser whilst the activation current is applied;
   monitoring the heat energy dissipated by the laser whilst the cooling current is applied; and
   in response to the dissipated heat energy balancing the accumulated heat energy, applying an idle current after application of the cooling current.

9. A method according to claim 7, comprising, in response to receiving a further activation signal after the selectively applying the cooling current, re-applying an activation current, which causes lasing of the laser unit.

10. A method according to claim 1, wherein the activation current is applied during on-scan periods of a laser scanning unit in which the laser unit is comprised, and
    wherein the cooling current is applied during off-scan periods of a laser scanning unit in which the laser unit is comprised.

11. A method according to claim 1, wherein the monitoring of the heat energy accumulated during application of the activation current comprises monitoring:
    energy provided by the applying of the idle current;
    energy provided by the applying of the activation current; and
    energy emitted by the laser,
    the method comprising second calculating a difference between the monitored energy provided by the activation current and a sum of the monitored energy provided by the idle current and the monitored energy emitted by the laser,
    wherein the selectively applying is carried out further on the basis of the second calculation.

12. A method according to claim 1, wherein the monitoring of the heat energy accumulated by the laser whilst the activation current is applied comprises monitoring residual heat energy from previous activation periods.

13. A laser unit having a laser diode, the laser unit configured to:
- apply an activation current to the laser diode in response to receiving an activation signal, which causes lasing of the laser unit;
- monitor heat energy accumulated by the laser diode whilst the activation current is applied;
- apply a cooling current to the laser diode in response to receiving a deactivation signal, which ceases lasing of the laser unit;
- monitor heat energy dissipated by the laser diode whilst the cooling current is applied; and
- in response to the heat energy dissipated by the laser diode balancing the heat energy accumulated by the laser diode, apply an idle current to the laser diode, the idle current being above the cooling current and below the activation current.

14. A laser unit according to claim 13, wherein the cooling current is applied immediately after receiving the deactivation signal.

15. A laser unit according to claim 13, wherein the idle current is a constant.

16. A laser unit according to claim 13, wherein the cooling current is a constant.

17. A non-transitory machine-readable storage medium encoded with instructions executable by a processor, the machine-readable storage medium comprising instructions to:
- cause application of an activation current to a laser diode in response to receiving a first activation signal, which causes lasing of the laser diode;
- in response to receipt of a first deactivation signal, selectively cause application of an idle current below the activation current;
- cause application of an activation current to the laser diode in response to receiving a second activation signal; and
- in response to receipt of a second deactivation signal, selectively cause application of a cooling current below the idle current, to the laser diode, which ceases lasing of the laser diode.

18. A non-transitory machine-readable storage medium according to claim 17, wherein the cooling current is a constant.

19. A non-transitory machine-readable storage medium according to claim 17, wherein the idle current is a constant.

20. A method of controlling a laser unit, the method comprising:
- in response to receiving an activation signal, applying an activation current which causes lasing of the laser unit;
- monitoring the heat energy dissipated by the laser; and
- in response to receiving a deactivation signal, selectively applying either:
  - an idle current below the activation current; or
  - a cooling current below the idle current, wherein the selectively applying is carried out at least on the basis of the monitoring of the dissipated heat energy.

* * * * *